(12) United States Patent
Bains (10) Patent No.: US 7,734,985 B2
(45) Date of Patent: Jun. 8, 2010

(54) SYSTEMS, METHODS, AND APPARATUSES FOR USING THE SAME MEMORY TYPE TO SUPPORT AN ERROR CHECK MODE AND A NON-ERROR CHECK MODE

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 510 days.

(21) Appl. No.: 11/364,107

(22) Filed: Feb. 27, 2006

(65) Prior Publication Data
US 2007/0220401 A1   Sep. 20, 2007

(51) Int. Cl.
*G11C 29/00* (2006.01)
(52) U.S. Cl. .............. 714/763; 365/230.03; 365/200; 365/226
(58) Field of Classification Search ............ 714/763
See application file for complete search history.

(56) References Cited

U.S. PATENT DOCUMENTS

| | | | |
|---|---|---|---|
| 5,896,404 A | | 4/1999 | Kellogg et al. |
| 6,005,823 A * | | 12/1999 | Martin et al. .......... 365/230.08 |
| 6,222,217 B1 * | | 4/2001 | Kunikiyo .................... 257/296 |
| 6,360,285 B1 * | | 3/2002 | Fenwick et al. ............... 710/17 |
| 6,397,290 B1 * | | 5/2002 | Williams et al. ............ 711/105 |
| 6,418,068 B1 * | | 7/2002 | Raynham ................... 365/200 |
| 6,480,982 B1 * | | 11/2002 | Chan et al. ................. 714/764 |
| 6,622,217 B2 * | | 9/2003 | Gharachorloo et al. ...... 711/141 |
| 6,658,509 B1 | | 12/2003 | Bonella et al. |
| 6,934,903 B1 * | | 8/2005 | Keltcher et al. ............. 714/763 |
| 2007/0061684 A1 | | 3/2007 | Rosenbluth et al. |
| 2007/0079217 A1 * | | 4/2007 | Haugan et al. .............. 714/763 |

FOREIGN PATENT DOCUMENTS

WO   WO-03102965   12/2003

OTHER PUBLICATIONS

Configuring DDR2 Memory on Dell Platforms Based on the Intel E7520 and E7525 Chip Sets; Dell, White Paper, Apr. 2005; pp. 1-10.
Intel 865G, Intel 865P, Intel 865PE Chipset Memory Configuration Guide; White Paper, May 2003; Doc No: 253036-001; pp. 1-13.

(Continued)

*Primary Examiner*—M. Mujtaba K Chaudry
*Assistant Examiner*—Enam Ahmed
(74) *Attorney, Agent, or Firm*—Blakely, Sokoloff, Taylor & Zafman LLP (57) ABSTRACT

Embodiments of the invention are generally directed to systems, methods, and apparatuses for using the same memory type in an error check mode and a non-error check mode. In some embodiments, a memory device includes at least one split bank pair of memory banks. If the memory device is in an error check mode, then, in some embodiments, data is stored in one of memory banks of the split bank pair and the corresponding error check bits are stored in the other memory bank of the split bank pair. A register bit on the memory device indicates whether it is in the error check mode or the non-error check mode. Other embodiments are described and claimed.

19 Claims, 8 Drawing Sheets

OTHER PUBLICATIONS

Acer DDR Memory Technology; White Paper, Aug. 2001; 15 pages.

Dell, Timothy J.: A White Paper on the Benefits of Chipkill-Correct ECC for PC Server Main Memory; IBM; Rev. Nov. 19, 1997; 24 pages.

Pending U.S. Appl. No. 11/205,645, filed Aug. 16, 2005; Inventor: Rosenbluth et al.

PCT Search Report dated Aug. 1, 2007 in related foreign matter P23409PCT.

International Preliminary Report on Patentability dated Sep. 12, 2008 in related foreign matter P23409PCT.

Bains, Chinese Application No. 200710100611.3, Entitled "Systems, Methods, And Apparatuses For Using The Same Memory Type In An Error Check Mode And A Non-Error Check Mode", filed Feb. 27, 2007., (Apr. 23, 2007), Absrtact.

Sipo, "First Office Action for Chinese Application No. 200710100611.3 dated Apr. 10, 2009,", Whole Document.

"Office Action (English Translation) for Korean Patent Application No.: 2008-7020849 dated Oct. 30, 2009", Whole Document.

* cited by examiner

| | 0 | 1 | 2 | 3 | 4 | 5 | 6 | 7 | 8 |
|---|---|---|---|---|---|---|---|---|---|
| 0 | d0 | d4 | d8 | d12 | d16 | d20 | d24 | d28 | d32 |
| 1 | d1 | d5 | d9 | d13 | d17 | d21 | d25 | d29 | d33 |
| 2 | d2 | d6 | d10 | d14 | d18 | d22 | d26 | d30 | d34 |
| 3 | d3 | d7 | d11 | d15 | d19 | d23 | d27 | d31 | d35 |

504

| 9 | 10 | 11 | 12 | 13 | 14 | 15 | 16 | 17 |
|---|---|---|---|---|---|---|---|---|
| d36 | d40 | d44 | d48 | d52 | d56 | d60 | ecc0 | ecc4 |
| d37 | d41 | d45 | d49 | d53 | d57 | d61 | ecc1 | ecc5 |
| d38 | d42 | d46 | d50 | d54 | d58 | d62 | ecc2 | ecc6 |
| d39 | d43 | d47 | d51 | d55 | d59 | d63 | ecc3 | ecc7 |

506

| | 0 | 1 | 2 | 3 | 4 | 5 | 6 | 7 | 8 |
|---|---|---|---|---|---|---|---|---|---|
| 0 | d64 | d68 | d72 | d76 | d80 | d84 | d88 | d92 | d96 |
| 1 | d65 | d69 | d73 | d77 | d81 | d85 | d89 | d93 | d97 |
| 2 | d66 | d70 | d74 | d78 | d82 | d86 | d90 | d94 | d98 |
| 3 | d67 | d71 | d75 | d79 | d83 | d87 | d91 | d95 | d99 |

508

| 9 | 10 | 11 | 12 | 13 | 14 | 15 | 16 | 17 |
|---|---|---|---|---|---|---|---|---|
| d100 | d104 | d108 | d112 | d116 | d120 | d124 | ecc9 | ecc12 |
| d101 | d105 | d109 | d113 | d117 | d121 | d125 | ecc9 | ecc13 |
| d102 | d106 | d110 | d114 | d118 | d122 | d126 | ecc10 | ecc14 |
| d103 | d107 | d111 | d115 | d119 | d123 | d127 | ecc11 | ecc15 |

Fig. 5

|   | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|----|----|----|----|----|----|----|----|
| 0 | WD=1 | d1 | d4 | d7 | d10 | d13 | d16 | CRC | CRC | WD=0 | ACT=0 | P=0 | ecc0 | ecc3 | ecc6 |  | CRC | CRC |
| 1 | d0 | d2 | d5 | d8 | d11 | d14 | d17 | d19 | CRC | R_W=1 |  |  | ecc1 | ecc4 | ecc7 |  |  | CRC |
| 2 | s0 | d3 | d6 | d9 | d12 | d15 | d18 | d20 | CRC | s0 |  |  | ecc2 | ecc5 |  |  | aP=0 | CRC |
| 3 | s1 | d65 | d68 | d71 | d74 | d77 | d80 | CRC | CRC | s1 |  |  | ecc8 | ecc11 | ecc14 |  | CRC | CRC |
| 4 | d64 | d66 | d69 | d72 | d75 | d78 | d81 | d83 | CRC |  |  |  | ecc9 | ecc12 | ecc15 |  |  | CRC |
| 5 |  | d67 | d70 | d73 | d76 | d79 | d82 | d84 | CRC |  |  |  | ecc10 | ecc13 |  |  |  |  |

602 ─ (columns 0–8) 604 ─ (columns 9–17) 610 ─ (ecc region)

Fig. 6A

| 18 | 19 | 20 | 21 | 22 | 23 | 24 | 25 | 26 |
|---|---|---|---|---|---|---|---|---|
| WD=1 | d22 | d25 | d28 | d31 | d34 | d37 | CRC | CRC |
| d21 | d23 | d26 | d29 | d32 | d35 | d38 | d40 | CRC |
| s0 | d24 | d27 | d30 | d33 | d36 | d39 | d41 | CRC |
| s1 | d87 | d90 | d93 | d96 | d99 | d102 | CRC | CRC |
| d85 | d88 | d91 | d94 | d97 | d100 | d103 | d105 | CRC |
| d86 | d89 | d92 | d95 | d98 | d101 | d104 | d106 | CRC |

606

| 27 | 28 | 29 | 30 | 31 | 32 | 33 | 34 | 35 |
|---|---|---|---|---|---|---|---|---|
| WD=1 | d43 | d46 | d49 | d52 | d55 | d58 | CRC | CRC |
| d42 | d44 | d47 | d50 | d53 | d59 | d59 | d61 | CRC |
| s0 | d45 | d48 | d51 | d54 | d57 | d60 | d62 | CRC |
| s1 | d108 | d111 | d114 | d117 | d120 | d123 | CRC | CRC |
| d63 | d109 | d112 | d115 | d118 | d121 | d124 | d126 | CRC |
| d107 | d110 | d113 | d116 | d119 | d122 | d125 | d127 | CRC |

Fig. 8

SYSTEMS, METHODS, AND APPARATUSES FOR USING THE SAME MEMORY TYPE TO SUPPORT AN ERROR CHECK MODE AND A NON-ERROR CHECK MODE

TECHNICAL FIELD

Embodiments of the invention generally relate to the field of integrated circuits and, more particularly, to systems, methods and apparatuses for using the same memory type to support an error check mode and a non-error check mode.

BACKGROUND

Memory devices are susceptible to errors such as transient (or soft) errors. If these errors are not handled properly, they can cause a computing system to malfunction. Redundant information in the form of error correcting codes (ECCs) can be used to improve overall system reliability. The redundant information, however, increases the storage requirement of the memory system and, thereby, increases the cost of the memory system. Thus, ECC is typically only used on high-end or mission critical systems. Lower cost (or less critical) systems do not use ECC and provide a level of reliability which is appropriate to their usage.

In some cases, the extra bits of storage are added to the system by adding additional memory devices (e.g., dynamic random access memory (DRAM) devices). For example, a system using eight DRAMs to store data may also use an additional DRAM to store the check codes. In other cases, the extra bits are stored in a variant DRAM designed especially for use in ECC systems. For example, a non-ECC DRAM may have 256 Mbits of capacity and 16 outputs. The ECC variant of that DRAM may have 288 Mbits of capacity and 18 outputs. In both of these examples, the ECC systems have 12.5% more storage capacity than the non-ECC counterparts.

The use of different DRAM devices in ECC systems has a number of disadvantages. For example, there is an increase in costs associated with designing, manufacturing, and inventorying, two (or more) variants of a DRAM device. In addition, an ECC variant DRAM device is larger than its non-ECC counterpart and, therefore, more difficult to manufacture. Adding the extra bits to the ECC variant DRAM lowers the yield of devices and, thus, increases the cost of the devices. Another disadvantage of using two (or more) variants of a DRAM device is that memory controllers that interface with the DRAM devices are required to support additional pins (e.g., ECC pins). Also, an ECC variant DRAM module uses more space on a motherboard because its connector is larger than its non-ECC counterpart.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses for using the same memory type to support an error check mode and a non-error check mode. In some embodiments, a memory device includes at least one split bank pair that has a first memory bank and a second memory bank. In the error check mode, data bits may be stored in one of the memory banks and the corresponding error check bits are stored in the other memory bank. The memory device may be configured to support either mode using a register bit (e.g., a mode register set (MRS) register bit). In some embodiments, the ability to support both an error check mode and a non-error check mode has a minimal impact on the interface with the memory controller. That is, substantially the same signaling, pin-count, and bust length may be used as in systems that support only a non-error check mode.

Figure 1:
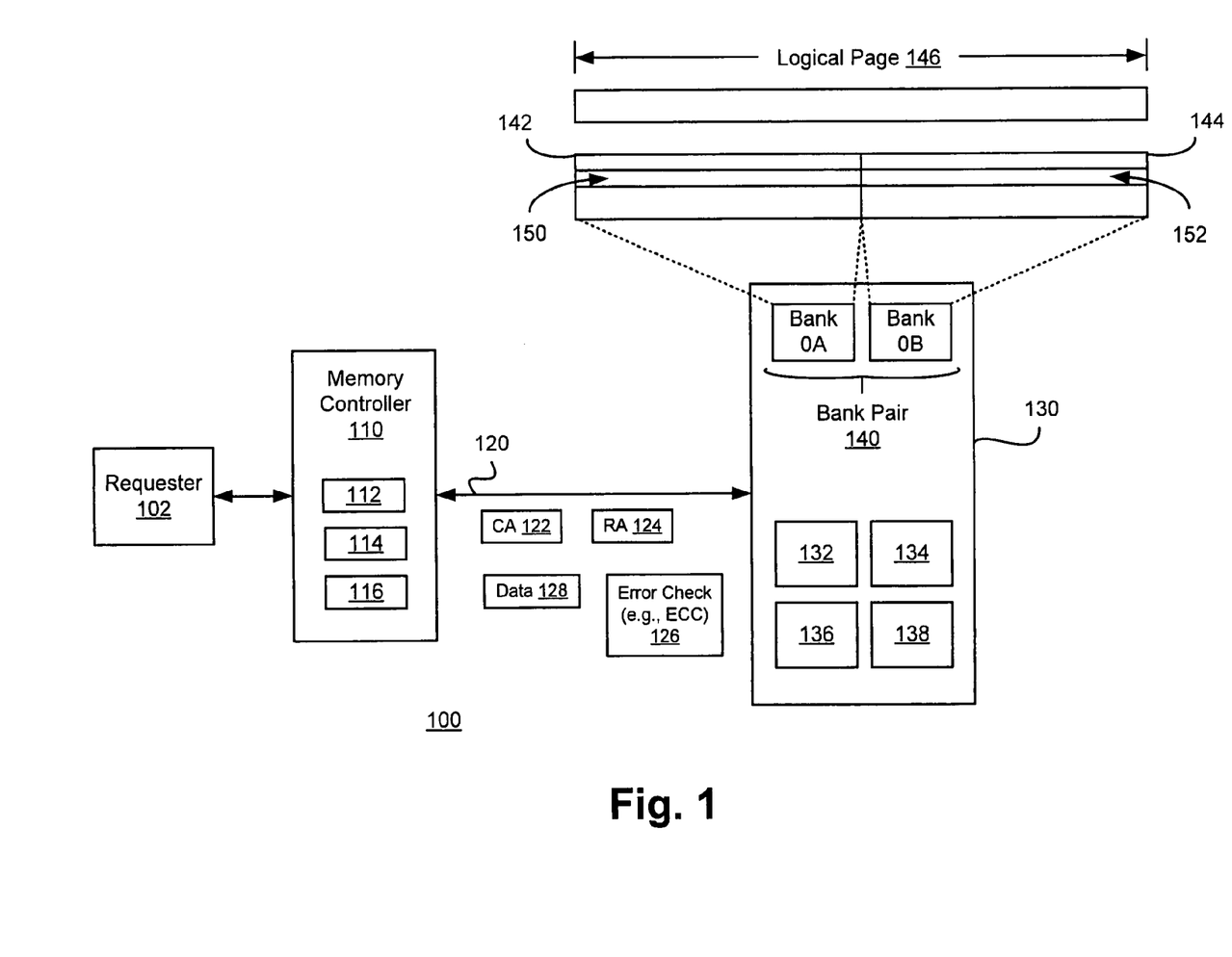
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. Computing system 100 includes requester 102, memory controller (or host) 110, memory device 130, and interconnect 120. Memory controller 110 controls, at least in part, the transfer of information between requester 102 and memory device 130. Requester 102 may be a processor (e.g., a central processing unit and/or a core), a service processor, an input/output device (e.g., a peripheral component interconnect (PCI) Express device), memory itself, or any other element of system 100 that requests access to memory. In some embodiments, memory controller 110 is on the same die as requester 102.

In the illustrated embodiment, memory controller 110 includes error check logic 112, mode indicator 114, and memory device addressing logic 116. Error check logic 112 uses redundant information to protect data from specified faults. In some embodiments, error check logic 112 is an error correction code (ECC).

As is further discussed below, in some embodiments, memory device 130 can operate in either an error check mode or a non-error check mode. When operating in an error check mode, memory device 130 stores both data bits and corresponding error check bits (e.g., ECC bits). When operating in a non-error check mode, (substantially) the entire capacity of memory device 130 is used to store data bits. Mode indicator 114 provides an indication of whether memory device 130 is operating in an error check mode or a non-error check mode. In some embodiments, mode indicator 114 includes one or more register bits.

In some embodiments, memory device 130 applies a different address mapping for read/write data depending on whether it is in the error check mode or the non-error check mode. For example, the address mapping used in the error check mode may account for the mapping of error check bits (e.g., ECC bits). Address mapping logic 116 enables memory controller 110 to be aware of the address mapping used by memory device 130. Address mapping logic 116 may be any logic capable of providing an indication of address mapping for a number of memory locations.

Memory device 130 may be any of a wide range of devices including a dynamic random access memory device (or, simply, a DRAM). In some embodiments, memory device 130 is organized into one or more split bank pairs 140. A split bank pair refers to a pair of memory banks that can be configured as either a single bank or as two separate banks. In some embodiments, each bank of the split bank pair has its own row decoder and column decoder.

In some embodiments, each bank of the split bank pair can provide a page of memory. For example, bank 0A provides page 142 and bank 0B provides page 144. A "bank" refers to an array of memory locations provided by a memory device. Collectively, banks 142 and 144 can provide logical page 146. The term "logical page" refers to a logical combination of two or more physical banks. In some embodiments, pages 142 and 144 each provide 1 kilobytes (K bytes) of memory and logical page 146 provides a net effective page size of 2K bytes.

In the illustrated embodiment, memory device 130 includes mode indicator 132, posted write buffer 134, partial write mask 136, and column address generation logic 138. Mode indicator 132 provides an indication of whether memory device 130 is operating in an error check mode or a non-error check mode. In some embodiments, mode indicator 132 includes one or more bits of a register such as a mode register set (MRS). Poster write buffer 134 is a buffer to which data is posted prior to be written to the memory core of memory device 130. Partial write mask 136 provides a write mask for data that is written to the memory core. In some embodiments, partial write mask 136 is used to access error check bits associated with data stored in memory device 130. In some embodiments, column address generation logic 138 generates column address information for error check bits associated with data stored in memory device 130.

Figure 2:
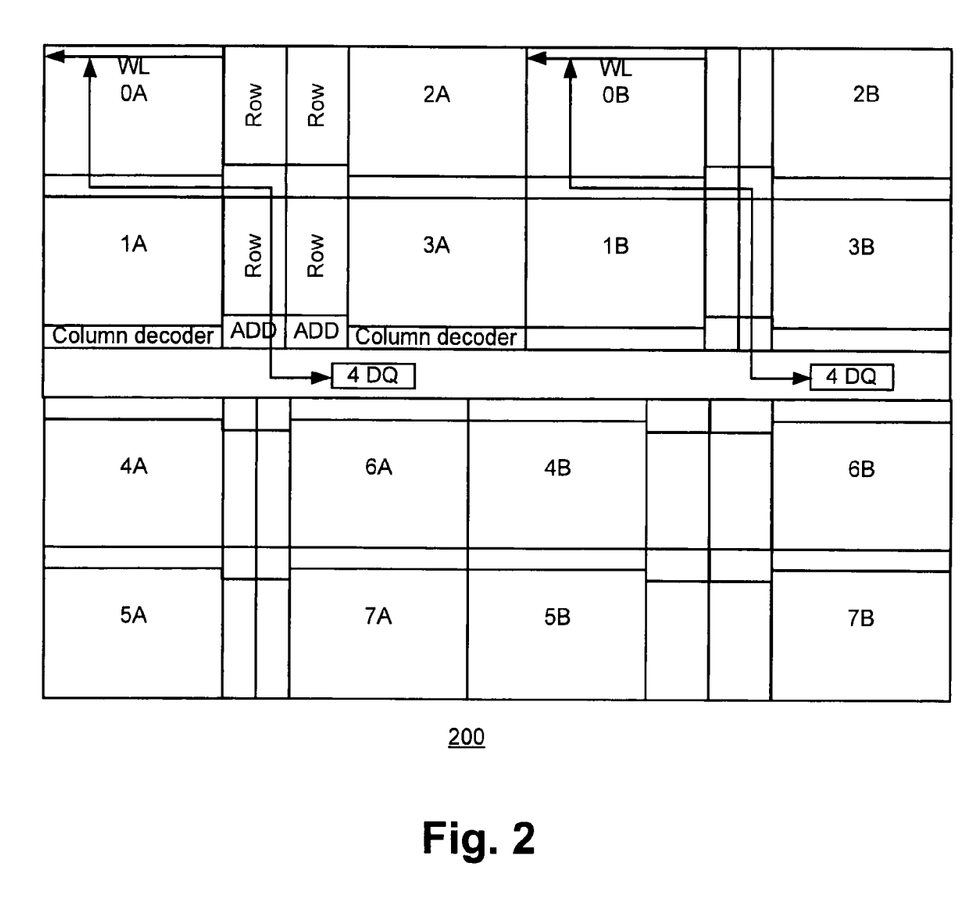
FIG. 2 is a block diagram illustrating selected aspects of a dynamic random access memory (DRAM) implemented according to an embodiment of the invention.

FIG. 2 is a block diagram illustrating selected aspects of a dynamic random access memory (DRAM) implemented according to an embodiment of the invention. DRAM 200 includes 16 memory banks (0A through 7B) or 8 split bank pairs (e.g., split bank pair 0A, 0B). In some embodiments, DRAM 200 can be configured as either a ×4 or a ×8 DRAM. In ×4 mode, DRAM 200 provides 16 banks (0A through 7B) and each bank provides 64 bits of data to 4 data (DQ) pins. In ×8 mode, DRAM 200 provides 8 split bank pairs to provide 128 bits of data to 8 DQ pins.

In some embodiments, DRAM 200 can be configured to operate in either an error check mode (e.g., an ECC mode) or a non-error check mode. When operating in an error check mode, DRAM 200 leverages its split bank architecture by storing data in one member of the split bank (e.g., bank 0A) and corresponding error check bits (e.g., ECC bits) in the other member of the split bank (e.g., bank 0B).

Figure 3:
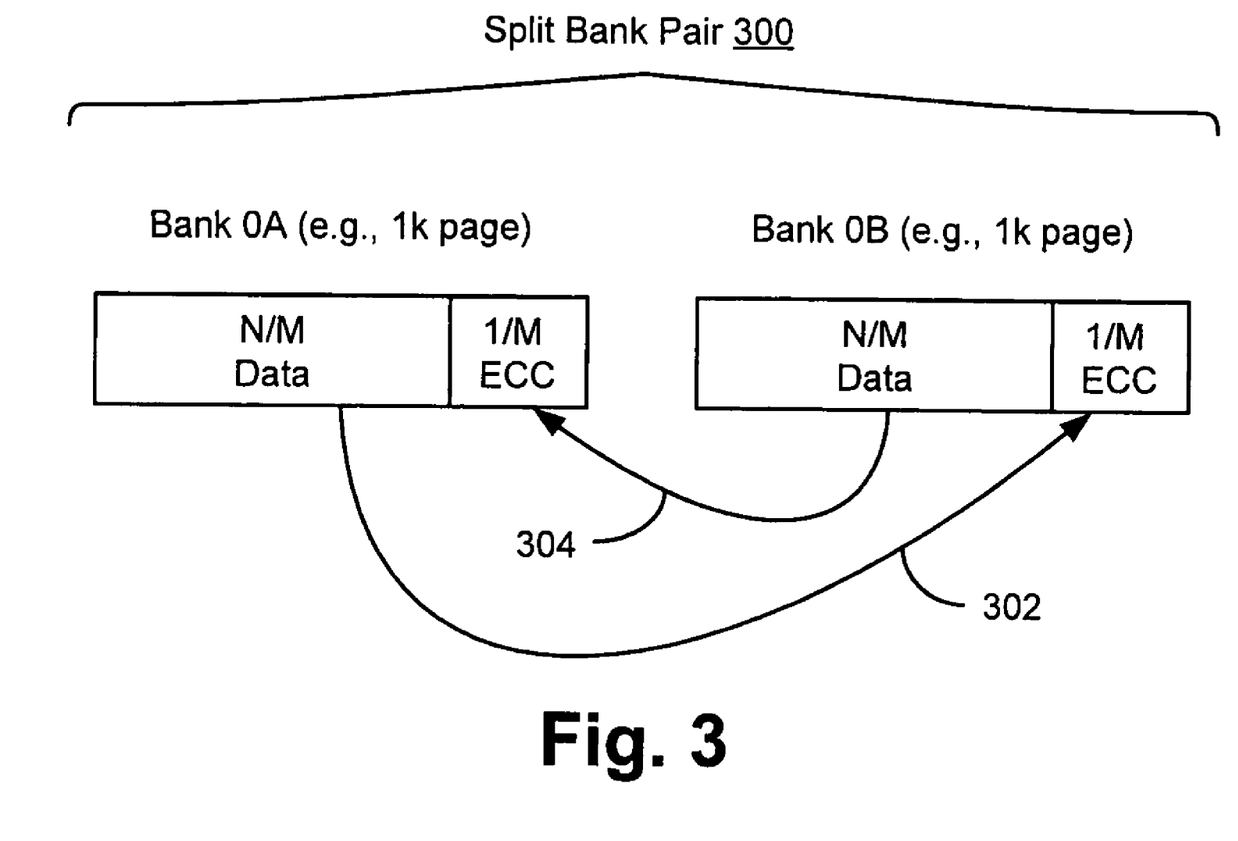
FIG. 3 is a block diagram illustrating selected aspects of a dynamic random access memory (DRAM) implemented according to an embodiment of the invention.

FIG. 3 is a block diagram illustrating selected aspects of storing data bits and error check bits in a split bank pair, according to an embodiment of the invention. Split bank pair 300 includes bank 0A and bank 0B. In some embodiments, data is stored in up to N/Mths (e.g., ⅞ths) of the locations in each bank and corresponding error check bits are stored in the last 1/Mth (e.g., ⅛) of the other member of split bank pair 300. For example, the error check bits covering the data stored in bank 0A may be stored in the top ⅛th of the memory locations of bank 0B (302). Similarly, the error check bits covering the data stored in bank 0B may stored in the top ⅛th of the memory locations of bank 0A (304). In some embodiments, the error check bits are error check code (ECC) bits.

In some embodiments, a host (e.g., memory controller 110, shown in FIG. 1) addresses a specific bank in the split bank pair to identify the bank that is receiving/providing the data bits. If the memory device is in the error check mode, then it uses its internal logic (e.g., partial write mask 136, column address generation logic 138, etc., shown in FIG. 1) to access the error check bits corresponding to the data bits. Accessing data bits and corresponding error check bits is further discussed below with reference to FIGS. 4-6B.

Figure 4:
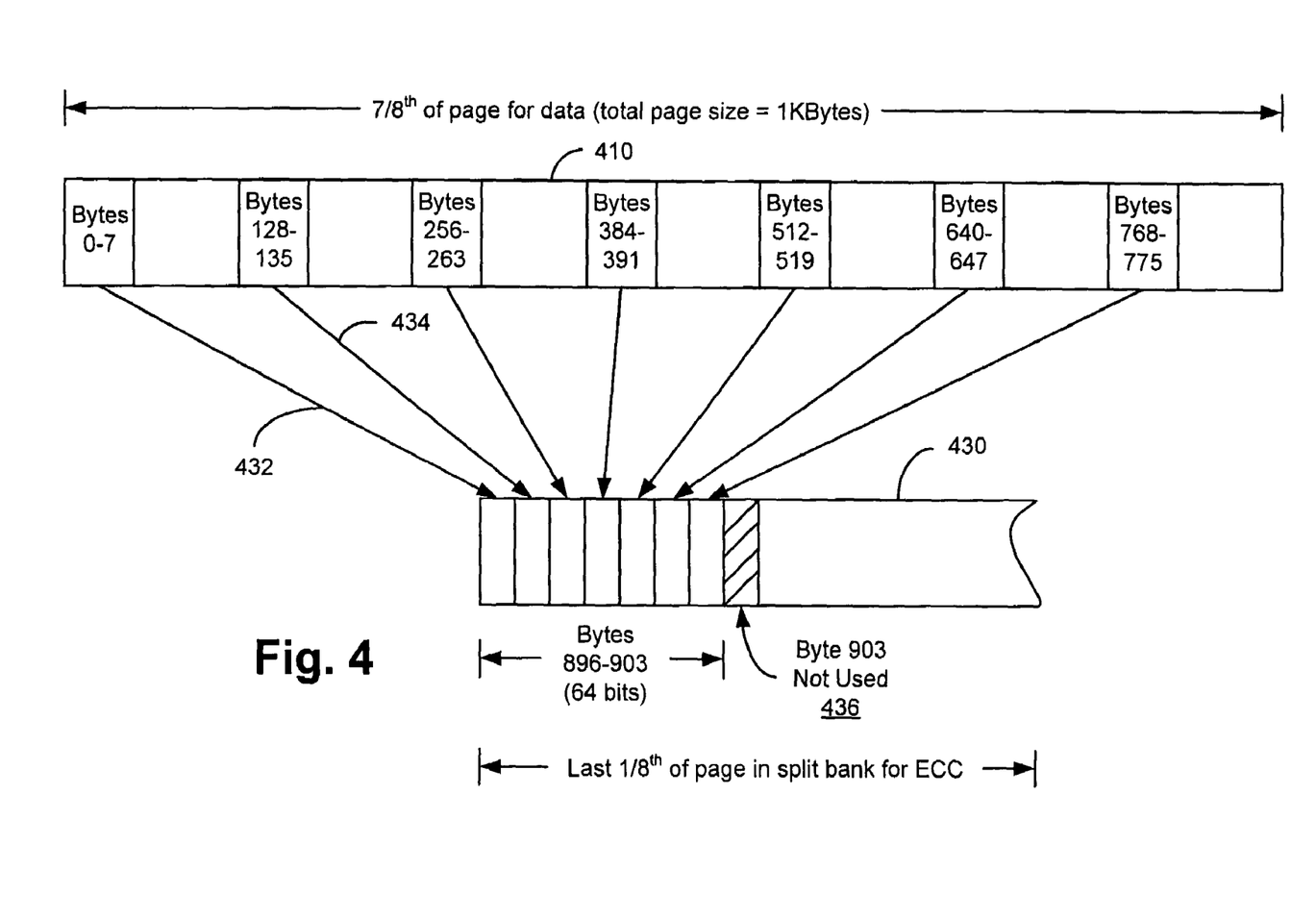
FIG. 4 is a block diagram illustrating an example of the address mapping between data bits and error check bits, according to an embodiment of the invention.

FIG. 4 is a block diagram illustrating an example of the address mapping between data bits and error check bits, according to an embodiment of the invention. In the illustrated embodiment, the data bits are stored in ⅞ths of a page that is provided by a bank within a split pair of banks as shown by 410. The corresponding error check bits are stored in the upper ⅛th of the other bank in the split bank pair (430). For example, the ECC bits covering bytes 0-7 are stored at memory location 896 as shown by reference number 432. Similarly, the ECC bits covering bytes 128-135 are stored at memory location 897 as shown by reference number 434 and this pattern is continued for the data bytes in page 410 as shown in FIG. 4. In some embodiments, the last byte of the upper ⅛th of bank 430 (e.g., location 903) is not used as shown by reference number 436. In some embodiments, the error check bits covering bytes 8-15 are stored in location 905 and the sequence repeats itself.

Referring again to FIG. 1, the sequence of events for reading from a DRAM is described. Memory controller 110 provides row address 124 to memory device 130. Memory device 130 activates the same row in both banks of the split bank pair based, at least in part, on row address 124. For example, memory device 130 opens rows 150 and 152 of banks 0A and 0B based on row address 124.

Memory controller 110 provides column address 122 (e.g., using a column address strobe (CAS) frame) to memory device 130. Memory device 130 uses column address 122 to access the data bits from the appropriate bank (e.g., bank 0A). In some embodiments, memory device 130 internally generates the column address for the error check bits based, at least in part, on column address 122. That is, memory device 130 internally generates the column address for the bank in which the error bits are stored. In some embodiments, memory device 130 forces a fraction of column address 122 high (e.g., logical 1's) to activate the top Mth of the row of the bank in which the error check bits are stored.

For example, in some embodiments, column address 122 includes eight column address (CA) bits CA 3 through CA 10. In such embodiments, memory device 130 may access the error check bits by forcing column address bits CA 8, CA 9, and CA 10 high and accessing eight bytes from the appropriate bank (e.g., bank 0B). Memory device 130 may then identify one of the eight bytes using the actual values of CA 8, CA 9, and CA 10. For example, if the actual values of CA 8 to CA 10 are "000," then memory device 130 will identify the first of the eight bytes of as the byte containing the error check bits. Similarly, if CA 8 to CA 10 are "001," then memory device 130 will identify the second byte as the byte containing the error check bits. Memory device 130 may then provide the read data and its associated error check bits to memory controller 110. In some embodiments, CA 3 to CA 7 are used from the read CAS frame.

Figure 5:
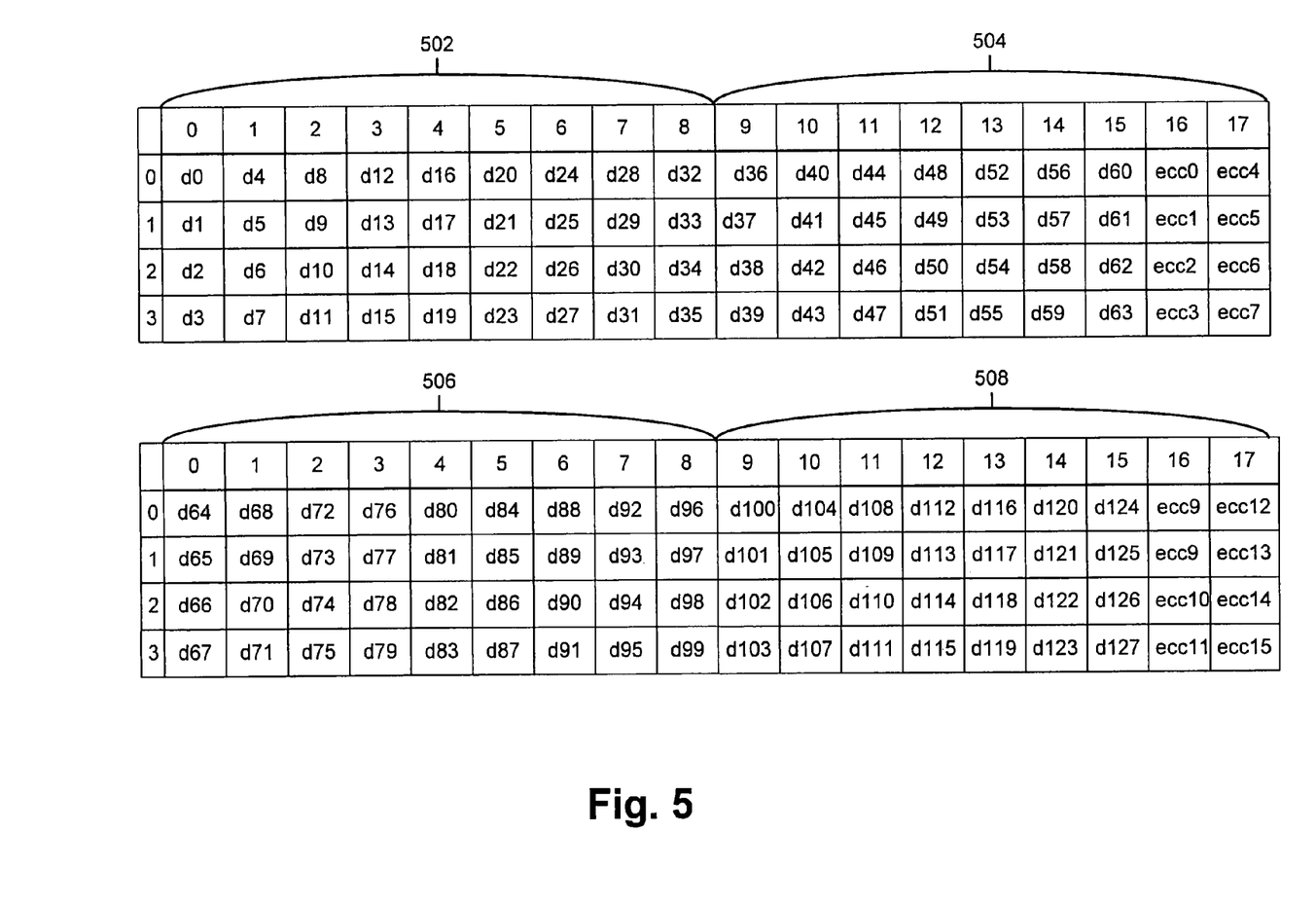
FIG. 5 illustrates selected aspects of read data frames, according to an embodiment of the invention.

FIG. 5 illustrates selected aspects of read data frames, according to an embodiment of the invention. If the system (e.g., system 100, shown in FIG. 1) is in the error check mode, then, in some embodiments, 64 bits of data are transferred over two back-to-back frames. For example, frames 502 and 504 convey 64 data bits in unit intervals 0 to 15 and 8 error check (e.g., ECC) bits in unit intervals (UIs) 16 and 17.

In some embodiments, two reads are performed in parallel and 128 data bits are transferred in four frames. For example, in the illustrated embodiment, frames 502 and 504 transfer the first 64 data bits (e.g., d0-d63) and frames 506 and 508 transfer another 64 data bits (e.g., d64-d127). The error check bits covering data bits d0-d63 are transferred in UIs 16 and 17 of frame 506 and the error check bits covering data bits d64-d127 are transferred in UIs 16 and 17 of frame 508. In alternative embodiments, the read frames may have a different structure and/or a different number of frames may be conveyed.

Referring again to FIG. 1, the sequence of events for writing data to a memory device (e.g., a DRAM) is described. The error check bits (e.g., ECC bits 126) and the data bits (e.g., data bits 128) are transferred from memory controller 110 and stored in buffer 134 (e.g., a posted write buffer). In addition, memory controller 110 also provides a row address 124 and a column address 122 (e.g., as part of a write CAS frame).

Memory device 130 activates the same row (e.g., rows 150 and 152) in both banks of split bank pair 140 based, at least in part, on row address 124. Data bits 128 are written to one of the banks of split bank pair 140 based on the data in the write CAS frame (e.g., column address 122 and the bits of a bank address field). Memory device 130 internally generates the column address for the error check bits based, at least in part, on column address 122. In some embodiments, the column address for the error check bits is generated by forcing CA 8 to C A 10 high and using CA 4 to CA 10 from the write CAS frame. In some embodiments, CA 2 to CA 0 are not used.

Typically, the number of error check bits is only a fraction of the number of data bits. For example, 8 error check bits may be used to cover 64 data bits. Thus, memory device 130 may generate a partial write mask to mask 56 bits and write the 8 error check bits to the column address that is based on CA 8 to CA 10 high and CA 4 to CA 10 as provided by the write CAS frame.

Figure 6A:
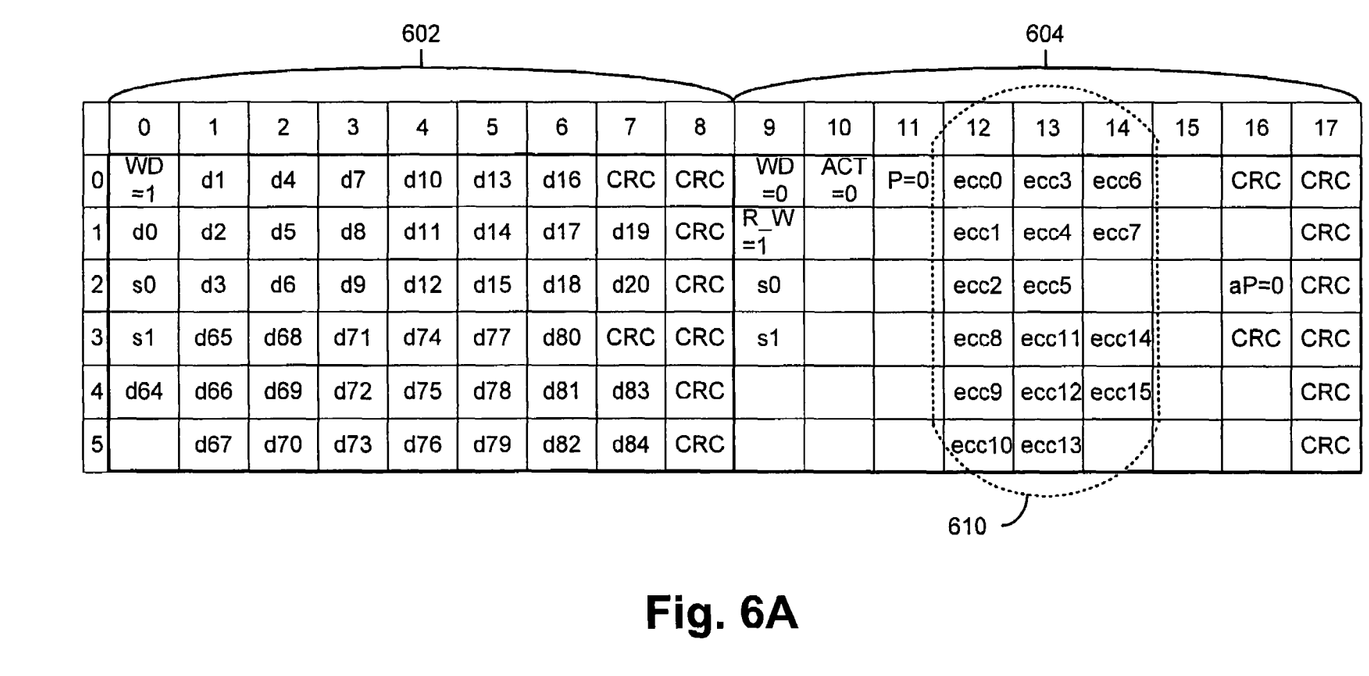
FIGS. 6A and 6B illustrate selected aspects of a sequence of write data frames, according to an embodiment of the invention.
Figure 6B:
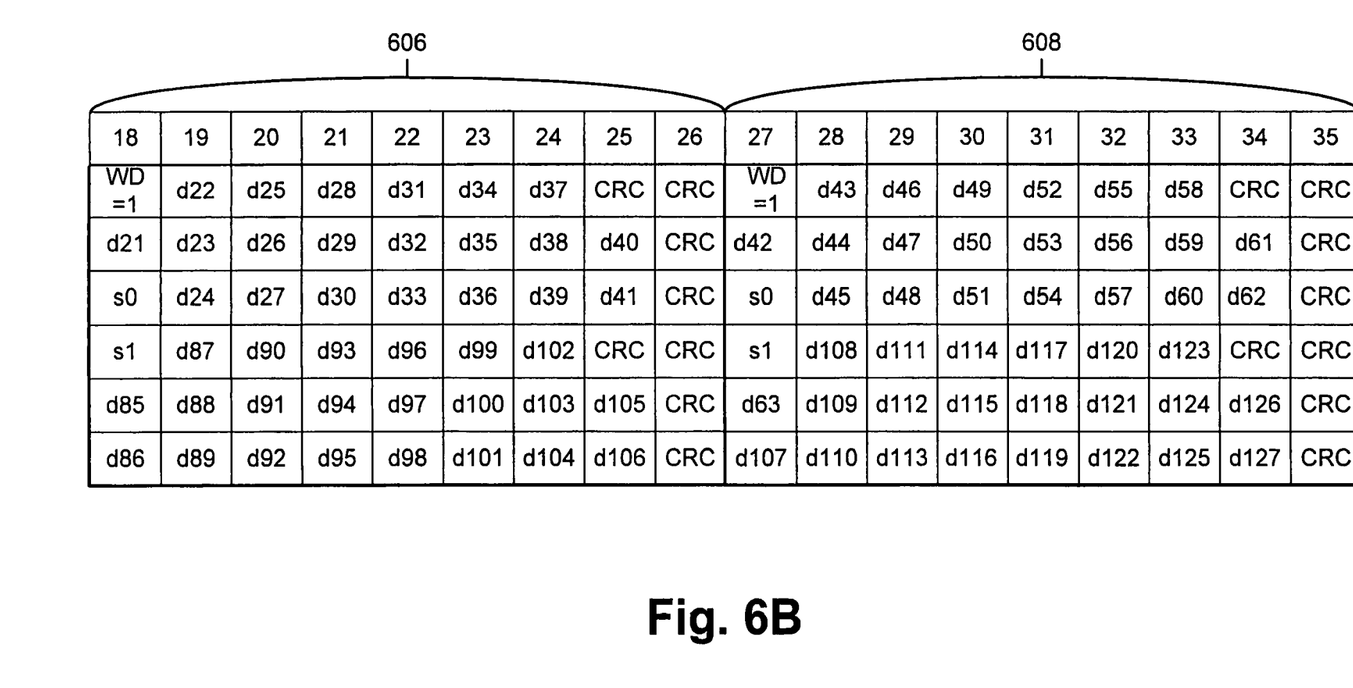

FIGS. 6A and 6B illustrate selected aspects of a sequence of write data frames, according to an embodiment of the invention. The write sequence illustrated in FIGS. 6A and 6B may be used in a system having a parallel memory channel with two memory devices. Each device sees all four frames and is assigned either D0 to D63 or D64 to D127. The assignment of memory devices is further discussed below.

In some embodiments, a write sequence includes the following frames: write header (Wh) 602, ECC write frame (We) 604, write data 1 (Wd1) 606, and write data 2 (Wd2) 608. In some embodiments, each frame is a six-bit frame (labeled 0 to 5) that is nine bits deep (e.g., UIs 0 to 8 or 9 to 17). Wh 602 includes header information for the write sequence as well as some data bits.

We 604 transfers the error check bits (e.g., ECC bits 610, shown in UIs 12-14) that cover the associated data bits. In some embodiments, the error check bits (e.g., ECC bits) are transferred to memory device 130 using partial write mask encoding. That is, We 604 may have the same command encoding as a partial write mask frame (Wm) except that the mask bits are replaced by error check bits (e.g., ECC bits 610, shown in UIs 12-14). ECC bits ECC0-ECC7 cover data bits D0-D63 and ECC bits ECC8-ECC 15 cover data bits D64-D127. In some embodiments, We frame 604 is required for all write data transfers when the system is operating in the error check mode.

Wd1 606 and Wd2 608 transfer the rest of the data bits for the write operation. Data bits D0-D63 are used by one memory device and D64-D127 are used by another memory device. In some embodiments a register bit within a memory device determines which memory device picks up which data bits. For example, the MRS register may be used to assign data bits to a memory device.

Figure 7:
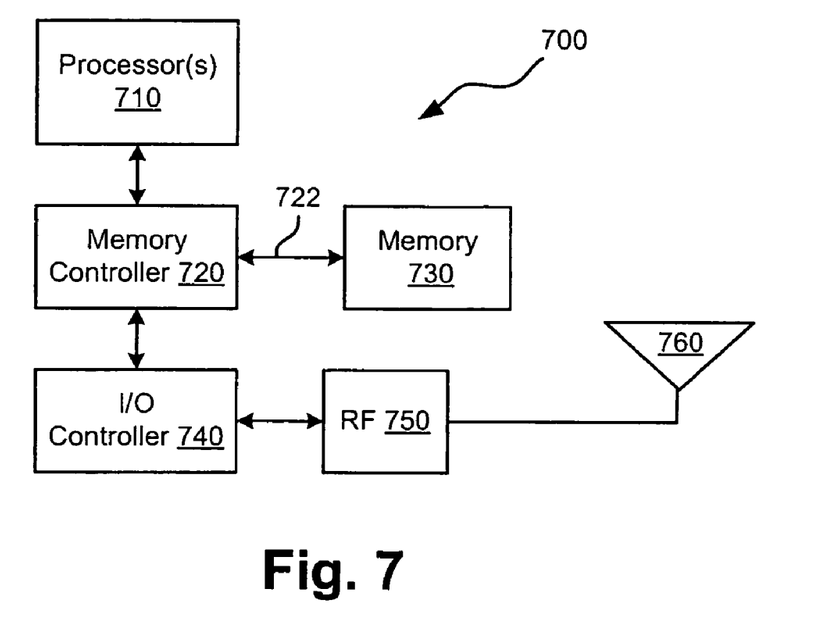
FIG. 7 is a block diagram illustrating selected aspects of an electronic system according to an embodiment of the invention.

FIG. 7 is a block diagram illustrating selected aspects of an electronic system according to an embodiment of the invention. Electronic system 700 includes processor 710, memory controller 720, memory 730, input/output (I/O) controller 740, radio frequency (RF) circuits 750, and antenna 760. In operation, system 700 sends and receives signals using antenna 760, and these signals are processed by the various elements shown in FIG. 7. Antenna 760 may be a directional antenna or an omni-directional antenna. As used herein, the term omni-directional antenna refers to any antenna having a substantially uniform pattern in at least one plane. For example, in some embodiments, antenna 760 may be an omni-directional antenna such as a dipole antenna or a quarter wave antenna. Also, for example, in some embodiments, antenna 760 may be a directional antenna such as a parabolic dish antenna, a patch antenna, or a Yagi antenna. In some embodiments, antenna 760 may include multiple physical antennas.

Radio frequency circuit 750 communicates with antenna 760 and I/O controller 740. In some embodiments, RF circuit 750 includes a physical interface (PHY) corresponding to a communication protocol. For example, RF circuit 750 may include modulators, demodulators, mixers, frequency synthesizers, low noise amplifiers, power amplifiers, and the like. In some embodiments, RF circuit 750 may include a heterodyne receiver, and in other embodiments, RF circuit 750 may include a direct conversion receiver. For example, in embodiments with multiple antennas 760, each antenna may be coupled to a corresponding receiver. In operation, RF circuit 750 receives communications signals from antenna 760 and provides analog or digital signals to I/O controller 740. Further, I/O controller 740 may provide signals to RF circuit 750, which operates on the signals and then transmits them to antenna 760.

Processor(s) 710 may be any type of processing device. For example, processor 710 may be a microprocessor, a microcontroller, or the like. Further, processor 710 may include any number of processing cores or may include any number of separate processors.

Memory controller 720 provides a communication path between processor 710 and other elements shown in FIG. 7. In some embodiments, memory controller 720 is part of a hub device that provides other functions as well. As shown in FIG. 7, memory controller 720 is coupled to processor(s) 710, I/O controller 740, and memory 730.

Memory 730 may include multiple memory devices. These memory devices may be based on any type of memory technology. For example, memory 730 may be random access memory (RAM), dynamic random access memory (DRAM), static random access memory (SRAM), nonvolatile memory such as FLASH memory, or nay other type of memory. In some embodiments, memory 730 may support an error check mode and a non-error check mode.

Memory 730 may represent a single memory device or a number of memory devices on one or more modules. Memory controller 720 provides data through interconnect 722 to memory 730 and receives data from memory 730 in response to read requests. Commands and/or addresses may be provided to memory 730 through interconnect 722 or through a different interconnect (not shown). Memory controller 730 may receive data to be stored in memory 730 from processor 710 or from another source. Memory controller 730 may provide the data it receives from memory 730 to processor 710 or to another destination. Interconnect 722 may be a bi-directional interconnect or a unidirectional interconnect. Interconnect 722 may include a number of parallel conductors. The signals may be differential or single ended. In some embodiments, interconnect 722 operates using a forwarded, multiphase clock scheme.

Memory controller 720 is also coupled to I/O controller 740 and provides a communications path between processor(s) 710 and I/O controller 740. I/O controller 740 includes circuitry for communicating with I/O circuits such as serial ports, parallel ports, universal serial bus (USB) ports and the like. As shown in FIG. 7, I/O controller 740 provides a communication path to RF circuits 750.

Figure 8:
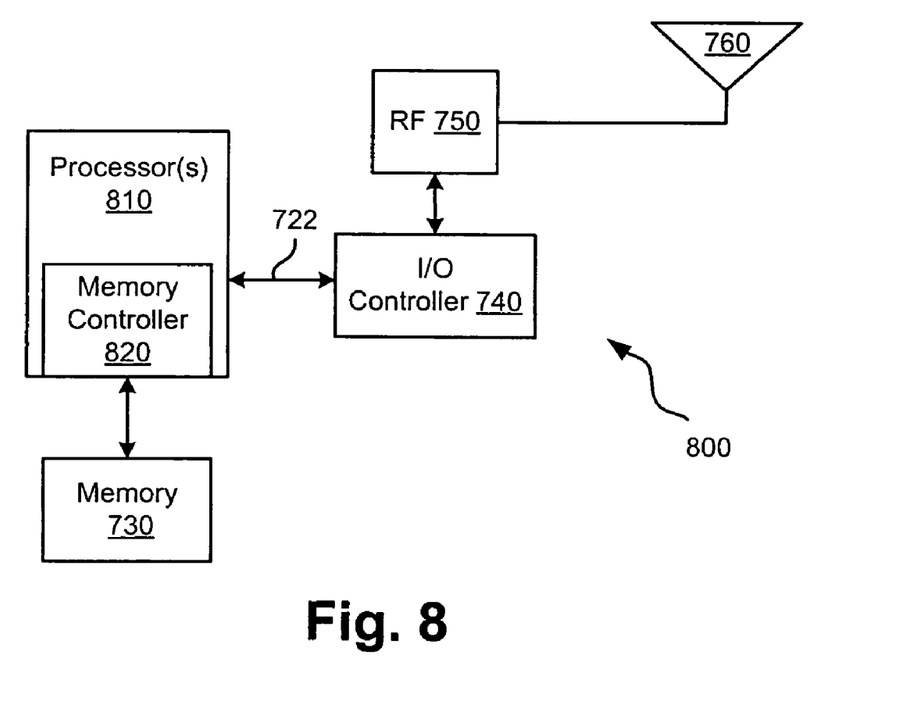
FIG. 8 is a bock diagram illustrating selected aspects of an electronic system according to an alternative embodiment of the invention.

FIG. 8 is a bock diagram illustrating selected aspects of an electronic system according to an alternative embodiment of the invention. Electronic system 800 includes memory 730, I/O controller 740, RF circuits 750, and antenna 760, all of which are described above with reference to FIG. 7. Electronic system 800 also includes processor(s) 810 and memory controller 820. As shown in FIG. 8, memory controller 820 may be on the same die as processor(s) 810. In some embodiments, memory controller 820 includes replay logic (e.g., replay logic 310, shown in FIG. 3) to detect defined errors, conduct automatic fast resets, and replay certain transactions. Processor(s) 810 may be any type of processor as described above with reference to processor 710 (FIG. 5). Example systems represented by FIGS. 7 and 8 include desktop computers, laptop computers, servers, cellular phones, personal digital assistants, digital home systems, and the like.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A memory device comprising:
    a split bank pair of memory banks including a first memory bank and a second memory bank, wherein the first memory bank and the second memory bank can be configured as either a single logical memory bank or as two separate memory banks;
    column address generation logic coupled to the split bank pair of memory banks; and
    a register bit to indicate whether the memory device is in an error check mode or a non-error check mode, wherein when the memory device is in the error check mode,
        a first row of the first memory bank to store data,
        a second row of the second memory bank to store error check bits corresponding to the data, and
        in response to a first column address and a row address being sent from the memory controller to the memory device:
            the memory device to access the data with the row address and the first column address,
            the column address generation logic to generate a different column address based on the first column address, and
            the memory device to activate a fraction of the second row with the row address and the different column address, the activating the fraction of the second row to access the error check bits.

2. The memory device of claim 1, further comprising:
    mapping logic to map the error check bits corresponding to data to be stored in the first memory bank to the second memory bank.

3. The memory device of claim 1, wherein the mapping logic comprises:
    mapping logic to map the error check bits to the top 1/M of the second memory bank.

4. The memory device of claim 3, wherein M is eight.

5. The memory device of claim 4, wherein the column address generation logic comprises:
    logic to drive a portion of a column address associated with the data to a logical high.

6. The memory device of claim 5, wherein the logic to drive the portion of the column address associated with the data to a logical high comprises:
    logic to drive column address bit 8 to column address bit 10 to a logical high.

7. The memory device of claim 5, wherein the register bit to indicate whether the memory device is in an error check mode or a non-error check mode is a mode register set (MRS) register.

8. The memory device of claim 5, wherein the column address generation logic further comprises:
    masking logic to mask at least a portion of the column address.

9. The memory device of claim 1, wherein the memory device includes a dynamic random access memory device.

10. A method comprising:
    determining whether a memory device is in an error check mode or a non-error check mode, the memory device having at least one split bank pair of memory banks wherein the split bank pair of memory banks can be configured as either a single logical memory bank or as two separate memory banks; and where the memory device is determined to be in the error check mode, and in response to a first column address and a row address being sent from the memory controller to the memory device:

writing data into a first row of a first memory bank of the split bank pair, the writing according to the row address and the first column address;

generating, with column address generation logic of the memory device, a different column address based on the first column address; and writing error check bits associated with the data into a second row of a second memory bank of the split bank pair, including activating a fraction of the second row with the row address and the different column address.

11. The method of claim 10, wherein generating the different column address comprises:

forcing a defined portion of the first column address to a logical high to map the error check bits to a top 1/M of the second memory bank.

12. The method of claim 11, wherein forcing the defined portion of the first column address to a logical high to map the error check bits to the top 1/M of the second memory bank comprises:

forcing bits 8 to 10 of the first column address to a logical high to map the error check bits to the top ⅛ of the second memory bank.

13. The method of claim 11, further comprising:
reading the data from the first memory bank; and
reading the error check bits associated with the data from the second memory bank.

14. The method of claim 10, wherein the memory device includes a dynamic random access memory device.

15. A system comprising:

a host to control a memory subsystem; and a memory device coupled with the host via an interconnect, the memory device including a split bank pair of memory banks including a first memory bank and a second memory bank, wherein the first memory bank and the second memory bank can be configured as either a single logical memory bank or as two separate memory banks;

column address generation logic coupled to the split bank pair of memory banks; and a register bit to indicate whether the memory device is in an error check mode or a non-error check mode, wherein when the memory device is in the error check mode, a first row of the first memory bank to store data, a second row of the second memory bank to store error check bits corresponding to the data, and in response to a first column address and a row address being sent from the memory controller to the memory device:

the memory device to access the data with the row address and the first column address, the column address generation logic to generate a different column address based on the first column address, and the memory device to activate a fraction of the second row with the row address and the different column address, the activating the fraction of the second row to access the error check bits.

16. The system of claim 15, wherein the interconnect comprises at least one:

a point-to-point interconnect; and a multipoint interconnect.

17. The system of claim 15, further comprising:

mapping logic to map the error check bits to the second memory bank.

18. The system of claim 17, wherein the mapping logic to map the error check bits to the second memory bank comprises:

mapping logic to map the error check bits to the top 1/M of the second memory bank.

19. The system of claim 18, wherein M is eight.

* * * * *